United States Patent [19]

Miner

[11] Patent Number: 4,755,964

[45] Date of Patent: Jul. 5, 1988

[54] MEMORY CONTROL CIRCUIT PERMITTING MICROCOMPUTER SYSTEM TO UTILIZE STATIC AND DYNAMIC RAMS

[75] Inventor: Jeffrey G. Miner, Mendham, N.J.

[73] Assignees: American Telephone and Telegraph Company; AT&T Bell Laboratories, both of Murray Hill, N.J.

[21] Appl. No.: 725,019

[22] Filed: Apr. 19, 1985

[51] Int. Cl.[4] ............................................. G06F 15/00
[52] U.S. Cl. .................................... 364/900; 365/233
[58] Field of Search ............... 364/200, 900 MS File; 307/266, 247 R; 328/58; 365/194, 233

[56] References Cited

U.S. PATENT DOCUMENTS 4,087,704  5/1978  Mehta et al. ..................... 307/262

FOREIGN PATENT DOCUMENTS 2834818  2/1980  Fed. Rep. of Germany .
57-40793  3/1982  Japan .

OTHER PUBLICATIONS

AT&T in House Document "Bus Idle Fix", date unknown.

Primary Examiner—Archie E. Williams, Jr.
Assistant Examiner—Thomas C. Lee
Attorney, Agent, or Firm—Alfred G. Steinmetz

[57] ABSTRACT

A memory accessing control for a microcomputer system is compatible with both static and dynamic type memories. A gating circuit is responsive to read/write and address latch enable control signals of a microprocessor, and provides an enable signal utilized to generate a chip enable signal compatible with the timing and control requirements of both dynamic and static memories.

5 Claims, 1 Drawing Sheet

MEMORY CONTROL CIRCUIT PERMITTING MICROCOMPUTER SYSTEM TO UTILIZE STATIC AND DYNAMIC RAMS

BACKGROUND OF THE INVENTION

This invention relates to memory accessing techniques in a microcomputer system and more particularly to a memory accessing scheme compatible with both static and dynamic memory.

The working memory of a microcomputer system normally comprises semiconductor RAMS which are memory cell arrays comprising transistor like devices. Generally, these memories or RAMS are divided into two general types. Static-type RAMS have their transistor devices arranged into individual flip-flop circuits in each memory cell. Dynamic type RAMS utilize the transistor devices for charge storage, and need periodic charge refreshing to retain the data stored in them. The circuitry to provide the charge refreshing is often embodied with the dynamic RAM itself on a single chip which is then normally designated as an integrated dynamic RAM. Integrated dynamic RAMS also organize the stored data on byte boundaries as opposed to the typical bit-wide storage of the pure dynamic RAM.

Operating characteristics of static and dynamic RAMS differ to the extent that a microcomputer system designed for one type of RAM cannot readily access the other type of RAM in a working memory system. Static RAM and indeed other static memory devices are responsive to voltage levels of control signals while dynamic or integrated dynamic RAMS are normally triggered by the leading edges of control signals. These differing requirements are reflected also in the timing of control signals to access working memory. For example, an address applied to a dynamic or integrated dynamic RAM must be stable during the leading edge of a chip enable signal. The timing requirements of the static RAM and other static memories are different.

For a given memory size, the dynamic RAM requires less space and power and in general is less expensive than the equivalent size static RAM. However, the dynamic RAM requires a fixed amount of additional interface circuitry (e.g., refresh circuitry) not required by static RAMS. Therefore, the dynamic RAM is more cost effective at large memory sizes and the static RAM excels at smaller memory sizes with an overlap wherein the static RAM competes with the integrated dynamic RAM. Generally, the development of static RAM chips of a given memory capacity lags behind the development of similar sized dynamic RAMS. So if a microcomputer system has fairly large memory requirements or space and power limitations and is within the overlap memory range, a working store comprised of integrated dynamic RAMS is generally specified. Subsequently, at a later state of memory development as static RAMS and memories of larger capacity become generally available, it may be desired to substitute static RAMS for the dynamic RAMS if they have become cost advantageous and have the required memory capacity and because of their simpler interfacing and operational control signal requirements. However, the substitution may not be feasible since the microprocessor or other aspects of the microcomputer system are not designed to accommodate static RAM. The need for redesign may dictate that the system continue to use the integrated dynamic RAMS initially specified when, in fact, the static RAM has become the preferred embodiment for the working memory.

SUMMARY OF THE INVENTION

A microcomputer system designed in accordance with the principles of the invention includes a chip enable gating circuit permitting the interchangeable use of both static and integrated dynamic RAMS without requiring redesign of the memory control system. In a particular system utilizing the Intel 8085 microprocessor, an asynchronous gating circuit independent of the microcomputer system clock is used to control application of chip enable signals to memory components. The gating circuitry is responsive to read/write and address latch enable signal outputs of the microprocessor to produce a properly timed enable signal to enable the memory decoder of the system to generate a chip enable signal compatible with both static memory components and integrated dynamic RAMS. The relative state of the read/write and address latch enable signals is captured or held in a latch or holding circuit and then gated as an enable signal to a memory decoder in response to transitions of both the @@read/write and address latch enable signals. The memory decoder supplies the necessary chip enable signal to the static or dynamic memory.

BRIEF DESCRIPTION OF THE DRAWINGS

An understanding of the invention may be readily attained by reference to the following specification and the accompanying drawings in which.

DETAILED DESCRIPTION

Figure 1:
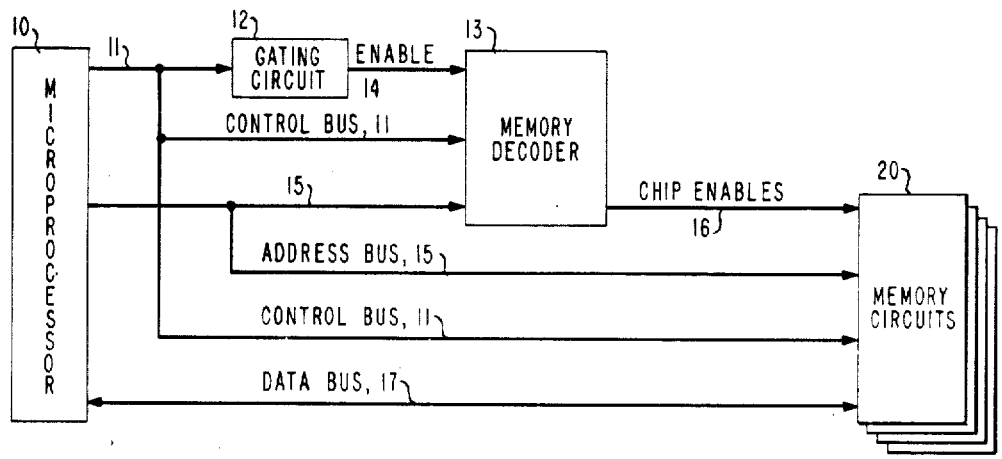
FIG. 1 is a block diagram of a microcomputer system embodying the principles of the invention.

A microcomputer system employing a memory accessing system embodying the principles of the invention is shown in FIG. 1. A control bus 11 is shown coupling control signal output from a microprocessor 10, which may be an INTEL 8085 microprocessor, to a gating circuit 12 to a memory decoder 13 and to memory circuits 20. Similarly, an address bus 15 couples J. G. Miner 1 address outputs from the microprocessor 10 to the memory decoder 13 and to memory circuits 20, which may comprise either static memory or integrated dynamic RAM. A data bus 17 is shown directly interconnecting the memory circuits 20 and the microprocessor 10. While three distinct busses 11, 15 and 17 are shown in FIG. 1, it is apparent to those skilled in the art that all or two of these may be multiplexed on a single physical channel without departing from the spirit and scope of the invention.

As is apparent from FIG. 1, the control signal output of the microprocessor 10 is applied via branches of bus 11 to the gating circuit 12, the memory decoder 13 and to the memory chip 20. The gating circuit 12 is operative in response to the control signals to generate an enable signal which is applied via lead 14 to the memory decoder 13, which also receives the control signal output and also an address from the microprocessor 10. The output of the memory decoder 13 on lead 16 is a properly timed and synchronized chip enable signal which is applied to the memory circuit 20. The memory decoder is operative therefore through the chip enable signal to activate the proper memory of a particular address to transmit or receive data whether it be static or dynamic memory.

Figure 2:
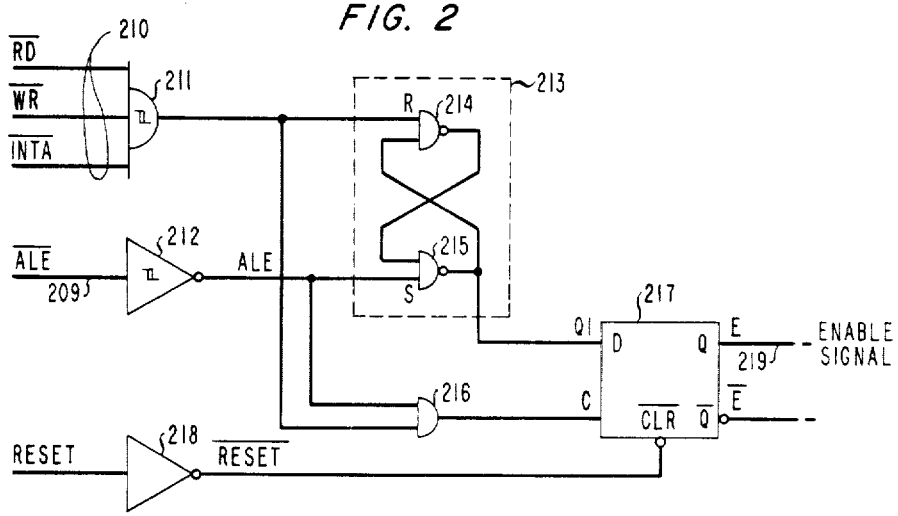
FIG. 2 is a schematic of a gating circuit employed in the computer system of FIG. 1.

The gating circuit is shown schematically in FIG. 2 and is connected to receive signal output from the microprocessor at inputs 209 and 210 and to apply an enable signal on lead 219 to the memory decoder from which the chip enable signal is derived. A chip enable signal, in order to be applicable to both static and dynamic memories, must be active throughout the memory cycle, including wait states, and must be free of false trigger signal-like glitches. This chip enable signal must also be active before read/write signals are supplied and must not be active before the address specified on the address bus has stabilized.

The read $\overline{RD}$, write $\overline{WR}$, and interrupt acknowledge $\overline{INTA}$ signal output of the microprocessor are coupled by leads 210 and applied to an AND gate 211 having inherent hysteresis characteristics by means of Schmitt-trigger inputs in order to avoid unstable switching of the gate. The interrupt acknowledge signal $\overline{INTA}$ while not a direct control signal in accessing the memory chips is applied to the AND gate 211 of the gating circuit in order to insure proper sequencing of the output state of the D-type flip-flop 217. The address latch enable $\overline{ALE}$ signal output of the microprocessor on lead 209 is applied to a polarity inverting circuit 212 also having a Schmitt-trigger hysteresis characteristic. The outputs of the AND gate 211 and the inverting circuit 212 are applied to an RS flip-flop 213 comprising two cross coupled NAND gates 214 and 215. The relation of the output of cross coupled NAND gates 214 and 215 to the inputs are shown by the pulse waveforms in FIG. 3. The output of AND gate 211 in response to the $\overline{RD}$, $\overline{WR}$ and $\overline{INTA}$ signals is shown as one waveform 302 occurring at the output of AND gate 211. These signals operate to activate the reset function of the RS flip-flop 213. The $\overline{ALE}$ signal output waveform 301 of inverter 212 operates to perform the set function of the RS flip-flop 213. The arrows from one waveform edge to another in FIG. 3 designate a near coincidence in time of the various pulse edges and the causal connections thereof. The output response of gate 215 of RS flip-flop 213 shown by waveform 303 in FIG. 3 is applied to the D input and used to define the output state of the D-type flip-flop 217.

Figure 3:
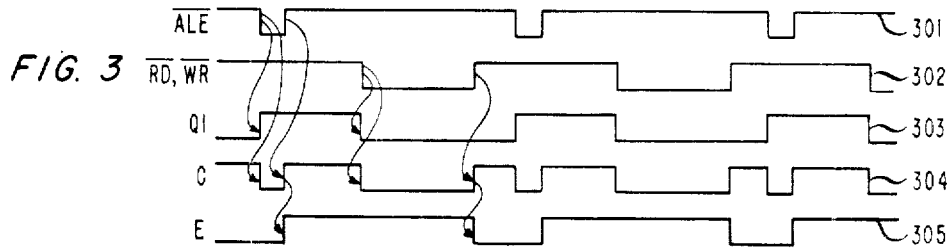
FIG. 3 depicts timing waveforms associated with the gating circuit of FIG. 2.

Both the set and reset inputs are also applied to an AND gate 216 whose output is shown by waveform 304 in FIG. 3 and is, in turn, applied to the clock input of the D-type flip-flop 217 wherein its rising edge causes the D-type flip-flop 217 to be clocked. As is well known, the clock input of a D-type flip-flop causes its D input to be replicated at its output. The output on lead 219 of the D-type flip-flop 217 shown by waveform 305 is utilized as an enable signal which, in turn, is applied to the enable input of the memory address decoder, which supplies the actual chip enable signal to the memory circuits. A system reset signal is applied via inverter 218 to the clear lead of D-type flip-flop 217 as required.

The gating circuit is able to generate an enable signal which insures that a chip enable signal is generated by the memory decoder that is suitable for proper enabling of both static and integrated dynamic memories. The resulting chip enable signal is active throughout the entire memory cycle to satisfy static memory requirements and is properly related to the read/write and address signals to satisfy the requirements of both types of memory. These enable signals are suitable for various type memories including the volatile type memory circuits discussed above and also nonvolatile type memory circuits such as ROM, EPROM, EEPROM, etc. This compatibility with various memory types allows a versatile expansion of memory capacity in a given microcomputer system without a redesign of memory access control.

What is claimed is:

1. An enable signal processing circuit for application in a microcomputing system in which
   a microprocessor supplying control signal outputs including read $\overline{RD}$, write $\overline{WR}$, interrupt acknowledge $\overline{INTA}$ and address latch enable $\overline{ALE}$ signals interacts with
   a memory circuit having a specified address and coupled to the microprocessor to receive and send data whereby the memory circuit comprises one of static memory circuit and dynamic memory circuit, and
   a memory decoder circuit coupled to supply chip enable signals to the memory circuit, in response to an enable signal input,
   the enable signal processing circuit comprising;
   gating circuitry for providing a properly timed enable signal to the memory decoder circuit including:
   a first AND logic circuit with hysteresis characteristics at its inputs and coupled to receive read $\overline{RD}$, write $\overline{WR}$ and interrupt acknowledge $\overline{INTA}$ signals from the microprocessor,
   a polarity inverting circuit with hysteresis characteristic at its inputs and coupled to receive an address latch enable signal $\overline{ALE}$ from the microprocessor,
   an RS flip-flop comprising first and second NAND gates cross coupled with each other and having a reset input coupled to an output of the first AND logic circuit and a set input coupled to an output of the polarity inverting circuit,
   a D-type flip-flop having its D input coupled to receive an output of the RS flip-flop, and a clock input and an output terminal to supply an enable signal,
   a second AND logic circuit coupled to receive inputs from the first AND logic circuit and the polarity inverting circuit and having its output coupled to the clock input of the D-type flip-flop, and
   the enable signal at the output terminal of the D-type flip-flop is coupled to the memory decoder circuit whereby a properly timed chip enable signal may be applied to the memory circuit.

2. A microcomputing system as defined in claim 1 and further comprising:
   circuitry for coupling a reset signal to a clear input of the D-type flip-flop.

3. An enable signal processing circuit for application in a microcomputer system in which:
   a microprocessor generates read/write signals, address signals and an enable signal for application to other devices in the microcomputer system that it wishes to access, including memory circuits accessible by the microprocessor via a bus whereby the memory circuits comprise ones of static memory circuits and dynamic memory circuits, and
   a memory decoder is coupled to receive the enable signal and generate a chip enable signal for application to the memory circuit that the microprocessor has designated to be accessed,
   the enable signal processing circuit comprising:

gating circuitry for coupling the enable signal output of the microprocessor to the memory decoder and for controlling the enable signal so that it is active before read/write signals are generated and is subsequent to generation of the address signals and that is continuous throughout access of the memory circuit by the miocroprocessor, the gating circuitry including:

a triggering memory circuit coupled to receive the enable signal and store a memory state representative of the state of the enable signal, a bistable device responsive to the read/write signal to generate a trigger signal which is applied to the triggering memory circuit, and the triggering memory circuit responding to the trigger signal to generate an output signal with a signal state representative of the memory state stored in the triggering memory circuit.

4. An enable signal processing circuit as defined in claim 3 wherein the triggering memory circuit comprises a D-type flip-flop having a D input responsive to an output of the bistable device and a clock input responsive to simultaneously occuring read/write and enable signals.

5. An enable signal processing circuit as defined in claim 4, wherein the bistable device comprises an RS flip-flop having a first input responsive to read/write signals and an output coupled to clock input of the D type flip flop.

* * * * *